US011249390B2

(12) United States Patent
Liu et al.

(10) Patent No.: US 11,249,390 B2
(45) Date of Patent: Feb. 15, 2022

(54) EXTREME ULTRAVIOLET MASK ABSORBER MATERIALS

(71) Applicant: Applied Materials, Inc., Santa Clara, CA (US)

(72) Inventors: Shuwei Liu, Singapore (SG); Vibhu Jindal, San Jose, CA (US); Halbert Chong, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 142 days.

(21) Appl. No.: 16/777,198

(22) Filed: Jan. 30, 2020

(65) Prior Publication Data

US 2020/0249557 A1 Aug. 6, 2020

Related U.S. Application Data

(60) Provisional application No. 62/799,290, filed on Jan. 31, 2019.

(51) Int. Cl.
*G03F 1/24* (2012.01)

(52) U.S. Cl.
CPC .................................... *G03F 1/24* (2013.01)

(58) Field of Classification Search
CPC ........................................................ G03F 1/24
USPC ............................................................ 430/5
See application file for complete search history.

(56) References Cited

U.S. PATENT DOCUMENTS

| | | | |
|---|---|---|---|
| 4,410,407 A | 10/1983 | Macaulay | |
| 5,641,593 A | 6/1997 | Watanabe et al. | |
| 5,944,967 A | 8/1999 | Kunz et al. | |
| 6,013,399 A | 1/2000 | Nguyen | |
| 6,132,566 A | 10/2000 | Hofmann et al. | |
| 6,323,131 B1 | 11/2001 | Obeng et al. | |
| 6,396,900 B1 | 5/2002 | Barbee, Jr. et al. | |
| 6,818,361 B2 | 11/2004 | Yan | |
| 7,390,596 B2* | 6/2008 | Ishibashi | B82Y 10/00 428/430 |
| 8,587,662 B1 | 11/2013 | Moll | |
| 8,691,476 B2 | 4/2014 | Yu et al. | |
| 8,802,335 B2 | 8/2014 | Oh et al. | |
| 8,932,785 B2 | 1/2015 | Utzny | |
| 9,329,597 B2 | 5/2016 | Stoschek et al. | |
| 9,580,796 B2 | 2/2017 | Ritchie et al. | |
| 9,612,522 B2 | 4/2017 | Hassan et al. | |
| 9,812,303 B2 | 11/2017 | Ritchie et al. | |
| 10,747,102 B2 | 8/2020 | Jindal | |
| 2003/0091910 A1 | 5/2003 | Schwarzl et al. | |
| 2003/0147058 A1 | 8/2003 | Murakami et al. | |
| 2003/0203289 A1 | 10/2003 | Yan et al. | |
| 2004/0151988 A1 | 8/2004 | Silverman | |
| 2004/0213971 A1 | 10/2004 | Colburn et al. | |
| 2004/0214113 A1 | 10/2004 | Goldstein et al. | |
| 2005/0074676 A1 | 4/2005 | Watanabe et al. | |
| 2005/0084773 A1 | 4/2005 | Krauth | |
| 2005/0208389 A1 | 9/2005 | Ishibashi et al. | |
| 2005/0227152 A1 | 10/2005 | Yan et al. | |
| 2005/0282072 A1 | 12/2005 | Hector et al. | |
| 2006/0029866 A1 | 2/2006 | Schwarzl et al. | |
| 2006/0251973 A1 | 11/2006 | Takaki et al. | |
| 2007/0020903 A1 | 1/2007 | Takehara et al. | |
| 2007/0090084 A1 | 4/2007 | Yan et al. | |
| 2008/0248409 A1 | 10/2008 | Ishibashi et al. | |
| 2009/0130569 A1 | 5/2009 | Quesnel | |
| 2010/0027107 A1 | 2/2010 | Yakshin et al. | |
| 2010/0167181 A1 | 7/2010 | Kim | |
| 2011/0020737 A1 | 1/2011 | Kamo et al. | |
| 2011/0104595 A1 | 5/2011 | Hayashi et al. | |
| 2011/0168545 A1 | 7/2011 | Shibamoto | |
| 2012/0069311 A1 | 3/2012 | Schwarzl et al. | |
| 2012/0088315 A1 | 4/2012 | Merelle et al. | |
| 2012/0129083 A1 | 5/2012 | Yoshimori et al. | |
| 2012/0322000 A1 | 12/2012 | Uno et al. | |
| 2013/0100428 A1 | 4/2013 | Ruoff et al. | |
| 2013/0162726 A1 | 6/2013 | Mizukami et al. | |
| 2013/0209927 A1 | 8/2013 | Deweerd | |
| 2013/0217238 A1 | 8/2013 | Boussie et al. | |
| 2013/0323626 A1 | 12/2013 | Chang | |
| 2014/0051015 A1 | 2/2014 | Gallagher | |
| 2014/0192335 A1 | 7/2014 | Hagio et al. | |
| 2014/0205936 A1 | 7/2014 | Kodera et al. | |
| 2014/0212794 A1 | 7/2014 | Maeshige et al. | |
| 2014/0218713 A1 | 8/2014 | Lu et al. | |
| 2014/0248555 A1 | 9/2014 | Chang et al. | |

(Continued)

FOREIGN PATENT DOCUMENTS

| | | |
|---|---|---|
| CN | 1900359 A | 1/2007 |
| EP | 3454119 A1 | 3/2019 |

(Continued)

OTHER PUBLICATIONS

Extended European Search Report in EP15819417.5 dated Nov. 2, 2017, 11 pages.
Machine Translation of JP 2007114336, 23 pages.
Machine Translation of JP 2009099931, 18 pages.
Non-Final Office Action in U.S. Appl. No. 14/620,114 dated Jul. 22, 2016, 15 pages.
Non-Final Office Action in U.S. Appl. No. 15/438,248 dated May 10, 2018, 15 pages.
PCT International Preliminary Report on Patentability in PCT/US2015/039525 dated Jan. 26, 2017, 9 pages.

(Continued)

*Primary Examiner* — Christopher G Young
(74) *Attorney, Agent, or Firm* — Servilla Whitney LLC

(57) ABSTRACT

Extreme ultraviolet (EUV) mask blanks, methods for their manufacture and production systems therefor are disclosed. The EUV mask blanks comprise a substrate; a multilayer stack of reflective layers on the substrate; a capping layer on the multilayer stack of reflecting layers; and an absorber layer on the capping layer, the absorber layer made from tellurium, germanium and antimony.

20 Claims, 6 Drawing Sheets

(56) References Cited

U.S. PATENT DOCUMENTS

| | | |
|---|---|---|
| 2014/0254001 A1 | 9/2014 | Sun et al. |
| 2014/0254018 A1 | 9/2014 | Sun et al. |
| 2014/0254890 A1 | 9/2014 | Bergman |
| 2014/0268080 A1 | 9/2014 | Beasley et al. |
| 2014/0272681 A1 | 9/2014 | Huang et al. |
| 2014/0272684 A1 | 9/2014 | Hofmann et al. |
| 2015/0024305 A1 | 1/2015 | Lu et al. |
| 2015/0064611 A1 | 3/2015 | Shih |
| 2015/0205298 A1 | 7/2015 | Stoschek et al. |
| 2015/0212402 A1 | 7/2015 | Patil |
| 2015/0279635 A1 | 10/2015 | Subramani et al. |
| 2015/0331307 A1 | 11/2015 | Lu et al. |
| 2016/0011344 A1 | 1/2016 | Beasley et al. |
| 2016/0011499 A1 | 1/2016 | Hassan et al. |
| 2016/0011500 A1 | 1/2016 | Hassan et al. |
| 2016/0011502 A1 | 1/2016 | Hofmann et al. |
| 2016/0147138 A1 | 5/2016 | Shih et al. |
| 2016/0161839 A1 | 6/2016 | Lu et al. |
| 2016/0196485 A1 | 7/2016 | Patterson et al. |
| 2016/0238924 A1 | 8/2016 | Burkhardt et al. |
| 2016/0238939 A1 | 8/2016 | Brunner et al. |
| 2016/0357100 A1 | 12/2016 | Ikuta |
| 2017/0062210 A1 | 3/2017 | Visser et al. |
| 2017/0092533 A1 | 3/2017 | Chakraborty et al. |
| 2017/0140920 A1 | 3/2017 | Arnepalli et al. |
| 2017/0115555 A1 | 4/2017 | Hofmann et al. |
| 2017/0131627 A1 | 5/2017 | Hassan et al. |
| 2017/0131637 A1 | 5/2017 | Hofmann et al. |
| 2017/0136631 A1 | 5/2017 | Li et al. |
| 2017/0160632 A1 | 6/2017 | Hassan et al. |
| 2017/0178877 A1 | 6/2017 | Wang et al. |
| 2017/0235217 A1 | 8/2017 | Qi et al. |
| 2017/0256402 A1 | 9/2017 | Kaufman-Osborn et al. |
| 2017/0263444 A1 | 9/2017 | Shoki et al. |
| 2017/0351169 A1 | 12/2017 | Yu et al. |
| 2018/0031964 A1 | 2/2018 | Jindal |
| 2018/0031965 A1 | 2/2018 | Jindal |
| 2018/0094351 A1 | 4/2018 | Verghese et al. |
| 2018/0120692 A1 | 5/2018 | Ikebe et al. |
| 2018/0291500 A1 | 10/2018 | Wang et al. |
| 2018/0292756 A1 | 10/2018 | Kong et al. |
| 2019/0004420 A1 | 1/2019 | Ozawa et al. |
| 2019/0056653 A1 | 2/2019 | Kawahara et al. |
| 2019/0078177 A1 | 3/2019 | Adelmann et al. |
| 2019/0079383 A1 | 3/2019 | Ikebe |
| 2019/0086791 A1 | 3/2019 | Tanabe |
| 2019/0088456 A1 | 3/2019 | Behara et al. |
| 2019/0113836 A1 | 4/2019 | Sun et al. |
| 2019/0196321 A1 | 6/2019 | Kim et al. |
| 2019/0382879 A1 | 12/2019 | Jindal et al. |
| 2019/0384156 A1 | 12/2019 | Tanabe |
| 2019/0384157 A1 | 12/2019 | Ikebe et al. |
| 2020/0056283 A1 | 2/2020 | Shero et al. |
| 2020/0218145 A1 | 7/2020 | Jindal |
| 2020/0371429 A1 | 11/2020 | Liu et al. |
| 2020/0371431 A1 | 11/2020 | Xiao et al. |

FOREIGN PATENT DOCUMENTS

| | | | |
|---|---|---|---|
| JP | S6376325 | A | 4/1988 |
| JP | 2003315977 | A | 11/2003 |
| JP | 2007114336 | A | 5/2007 |
| JP | 2007273678 | A | 10/2007 |
| JP | 2009099931 | A | 5/2009 |
| JP | 2012503318 | A | 2/2012 |
| JP | 2013120868 | A | 6/2013 |
| JP | 2015008283 | A | 1/2015 |
| JP | 2001085332 | A1 | 5/2018 |
| JP | 2018173664 | A | 11/2018 |
| KR | 20070036519 | A | 4/2007 |
| KR | 20080001023 | A | 1/2008 |
| KR | 100879139 | B1 | 1/2009 |
| KR | 100972863 | B1 | 7/2010 |
| KR | 20110050427 | A | 5/2011 |
| KR | 20110120785 | A | 11/2011 |
| KR | 20150056435 | A | 5/2015 |
| KR | 20160002332 | A | 1/2016 |
| KR | 20160143917 | A | 12/2016 |
| KR | 20170021190 | A | 2/2017 |
| KR | 20170021191 | A | 2/2017 |
| KR | 20180127197 | A | 11/2018 |
| TW | 200938502 | A | 9/2009 |
| TW | 201331699 | A | 8/2013 |
| TW | 201606335 | A | 2/2016 |
| WO | 2011157643 | A1 | 12/2011 |
| WO | 2013152921 | A1 | 10/2013 |
| WO | 2016007613 | A1 | 1/2016 |
| WO | 2018156452 | A1 | 8/2018 |

OTHER PUBLICATIONS

PCT International Preliminary Report on Patentability in PCT/US2015/039533 dated Jan. 26, 2017, 10 pages.
PCT International Preliminary Report on Patentability in PCT/US2017/042747 dated Jul. 26, 2018, 10 pages.
PCT International Preliminary Report on Patentability in PCT/US2017/042748 dated Jul. 26, 2018, 10 pages.
PCT International Search Report and Written Opinion in PCT/US2015/039525 dated Sep. 18, 2015, 10 pages.
PCT International Search Report and Written Opinion in PCT/US2015/039533 dated Sep. 21, 2015, 11 pages.
PCT International Search Report and Written Opinion in PCT/US2017/042747 dated Nov. 2, 2017, 14 pages.
PCT International Search Report and Written Opinion in PCT/US2017/042748 dated Nov. 2, 2017, 15 pages.
PCT International Search Report and Written Opinion in PCT/US2019/042143 dated Oct. 29, 2019, 11 pages.
PCT International Search Report and Written Opinion in PCT/US2019/058013 dated Feb. 14, 2020, 12 pages.
PCT International Search Report and Written Opinion PCT/US2018/067108 dated May 27, 2019, 13 pages.
Braun, Stefan, et al., "Multi-component EUV multilayer mirrors", Proc. of SPIE, vol. 5037 (2003), pp. 274-285.
Herregods, Sebastiaan J.F., et al., "Vapour phase self-assembled monolayers for ALD blocking on 300 mm wafer scale", 3 pages.
Jadhav, Sushilkumar A., "Self-assembled monolayers (SAMs) of carboxylic acids: an overview", Central European Journal of Chemistry, 369-378.
Snow, A. W., et al., "Packing density of HS(CH2)nCOOH self-assembled monolayers", Analyst, 2011, 136, 4935, 4935-4949.
Zon, Jerzy, et al., "Synthesis of Phosphonic Acids and Their Esters as Possible Substrates for Reticular Chemistry", 2012, RCS publishing, Chapter 6, total pp. 36. (Year: 2012).
PCT International Search Report and Written Opinion in PCT/US2021/014105 dated May 12, 2021, 10 pages.
PCT International Search Report and Written Opinion in PCT/US2021/015067 dated May 21, 2021, 9 pages.
PCT International Search Report and Written Opinion in PCT/US2021/015068 dated May 26, 2021, 10 pages.
PCT International Search Report and Written Opinion in PCT/US2021/015069 dated May 21, 2021, 11 pages.
Machine Translation of KR20070036519, 7 pages.
Non-Final Office Action in U.S. Appl. No. 15/652,501 dated Apr. 20, 2020, 7 pages.
PCT International Search Report and Written Opinion in PCT/US2020/016021 dated May 29, 2020, 11 pages.
Non-Final Office Action in U.S. Appl. No. 16/662,753 dated Jun. 17, 2021, 6 pages.
Non-Final Office Action in U.S. Appl. No. 16/801,635, dated Jul. 6, 2021, 10 pages.
PCT International Search Report and Written Opinion in PCT/US2020/016022 dated Jun. 5, 2020, 11 pages.
PCT International Search Report and Written Opinion in PCT/US2020/020034 dated Jun. 23, 2020, 9 pages.
PCT International Search Report and Written Opinion in PCT/US2020/016023 dated Jun. 29, 2020, 11 pages.
Non-Final Office Action in U.S. Appl. No. 16/821,444 dated Aug. 28, 2020, 24 pages.

(56) References Cited

OTHER PUBLICATIONS

PCT International Search Report and Written Opinion in PCT/US2020/033718 dated Sep. 9, 2020, 12 pages.
PCT International Search Report and Written Opinion in PCT/US2020/033719 dated Sep. 9, 2020, 12 pages.
PCT International Search Report and Written Opinion in PCT/US2020/033722 dated Sep. 1, 2020, 11 pages.
PCT International Search Report and Written Opinion in PCT/US2020/033723 dated Aug. 28, 2020, 12 pages.
PCT International Search Report and Written Opinion in PCT/US2020/033724 dated Sep. 9, 2020, 11 pages.
PCT International Search Report and Written Opinion in PCT/US2020/033725 dated Aug. 28, 2020, 11 pages.
PCT International Search Report and Written Opinion in PCT/US2020/033728 dated Aug. 28, 2020, 11 pages.
PCT International Search Report and Written Opinion in PCT/US2020/033729 dated Sep. 9, 2020, 11 pages.
U.S. Appl. No. 16/861,788, filed Oct. 12, 2020, 33 pages.
Final Office Action in U.S. Appl. No. 16/229,659 dated Jul. 1, 2020, 10 pages.
Non-Final Office Action in U.S. Appl. No. 16/512,693 dated Feb. 3, 2021, 16 pages.
PCT International Search Report and Written Opinion in PCT/US2019/040682 dated Oct. 23, 2019, 13 pages.
PCT International Search Report and Written Opinion in PCT/US2019/067751 dated Apr. 23, 2020, 10 pages.
PCT International Search Report and Written Opinion in PCT/US2020/020029 dated Jun. 30, 2020, 10 pages.
PCT International Search Report and Written Opinion in PCT/US2020/020031 dated Jun. 30, 2020, 12 pages.
PCT International Search Report and Written Opinion in PCT/US2020/020033 dated Jun. 26, 2020, 11 pages.
PCT International Search Report and Written Opinion in PCT/US2020/028669 dated Aug. 7, 2020, 14 pages.
PCT International Search Report and Written Opinion in PCT/US2020/044712 dated Nov. 27, 2020, 11 pages.

\* cited by examiner

EXTREME ULTRAVIOLET MASK ABSORBER MATERIALS

CROSS-REFERENCE TO RELATED APPLICATIONS

This application claims priority to U.S. Provisional Application No. 62/799,290, filed Jan. 31, 2019, the entire disclosure of which is hereby incorporated by reference herein.

TECHNICAL FIELD

The present disclosure relates generally to extreme ultraviolet lithography, and more particularly extreme ultraviolet mask blanks with an alloy absorber and methods of manufacture.

BACKGROUND

Extreme ultraviolet (EUV) lithography, also known as soft x-ray projection lithography, can be used for the manufacture of 0.0135 micron and smaller minimum feature size semiconductor devices. However, extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light within an extremely narrow ultraviolet bandpass, for example, 12.5 to 14.5 nanometer bandpass for 13.5 nanometer ultraviolet light.

FIG. 1 shows a conventional EUV reflective mask 10, which is formed from an EUV mask blank, which includes a reflective multilayer stack 12 on a substrate 14, which reflects EUV radiation at unmasked portions by Bragg interference. Masked (non-reflective) areas 16 of the conventional EUV reflective mask 10 are formed by etching buffer layer 18 and absorbing layer 20. The absorbing layer typically has a thickness in a range of 51 nm to 77 nm. A capping layer 22 is formed over the reflective multilayer stack 12 and protects the reflective multilayer stack 12 during the etching process. As will be discussed further below, EUV mask blanks are made on a low thermal expansion material substrate coated with multilayers, a capping layer and an absorbing layer, which is then etched to provide the masked (non-reflective) areas 16 and reflective areas 24.

The International Technology Roadmap for Semiconductors (ITRS) specifies a node's overlay requirement as some percentage of a technology's minimum half-pitch feature size. Due to the impact on image placement and overlay errors inherent in all reflective lithography systems, EUV reflective masks will need to adhere to more precise flatness specifications for future production. Additionally, EUV blanks have a very low tolerance to defects on the working area of the blank. Furthermore, while the absorbing layer's role is to absorb light, there is also a phase shift effect due to the difference between the absorber layer's index of refraction and vacuum's index of refraction (n=1), and this phase shift that accounts for the 3D mask effects. There is a need to provide EUV mask blanks having a thinner absorber to mitigate 3D mask effects.

SUMMARY

One or more embodiments of the disclosure are directed to a method of manufacturing an extreme ultraviolet (EUV) mask blank comprising forming on a substrate a multilayer stack which reflects EUV radiation, the multilayer stack comprising a plurality of reflective layer pairs; forming a capping layer on the multilayer stack; and forming an absorber layer on the capping layer, the absorber layer comprising an alloy of tellurium, germanium and antimony.

Additional embodiments of the disclosure are directed to an EUV mask blank comprising a substrate; a multilayer stack which reflects EUV radiation, the multilayer stack comprising a plurality of reflective layer; a capping layer on the multilayer stack of reflecting layers; and an absorber layer comprising an alloy of tellurium, germanium and antimony.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

Figure 1:
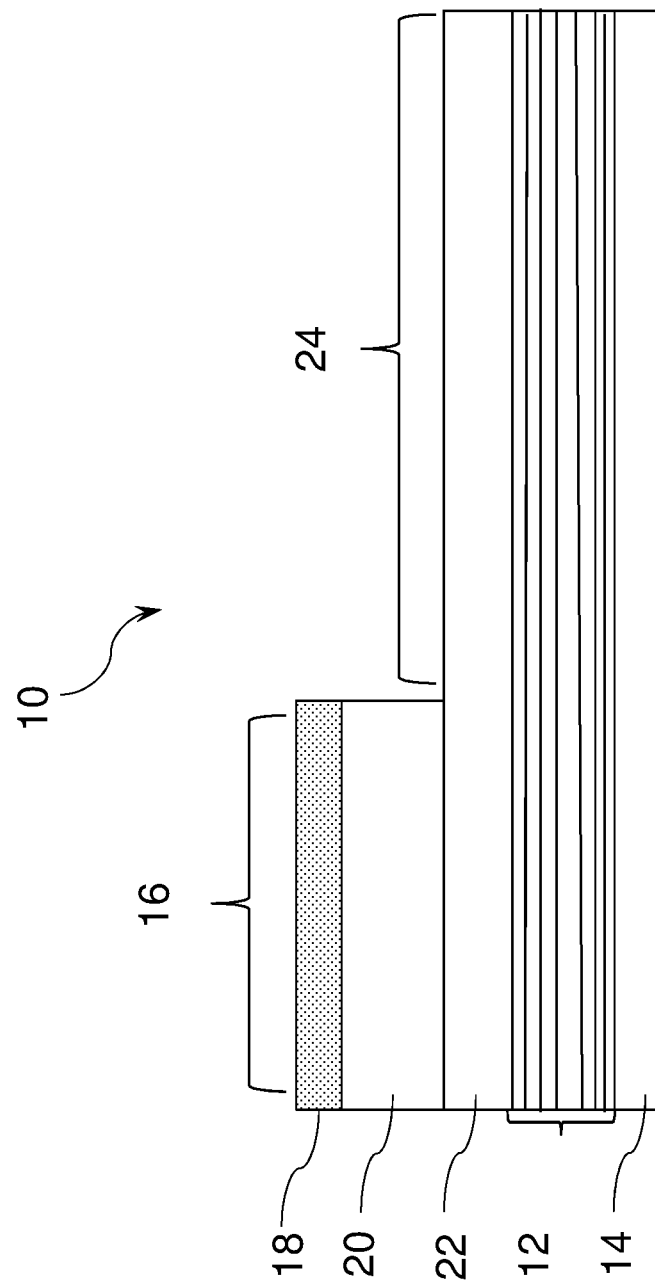
FIG. 1 schematically illustrates a background art EUV reflective mask employing a conventional absorber.
Figure 2:
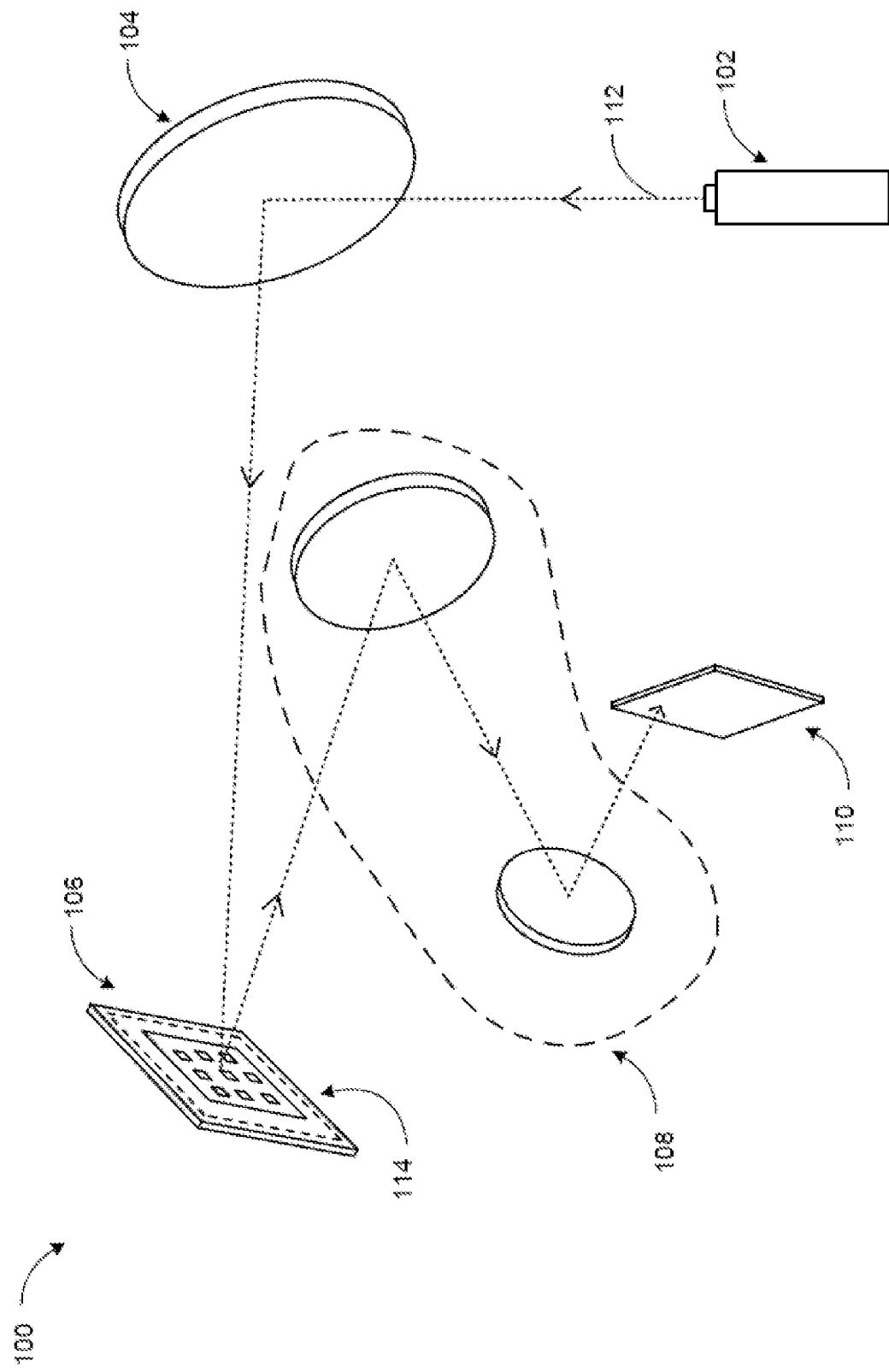
FIG. 2 schematically illustrates an embodiment of an extreme ultraviolet lithography system.

Referring now to FIG. 2, an exemplary embodiment of an extreme ultraviolet lithography system 100 is shown. The extreme ultraviolet lithography system 100 includes an extreme ultraviolet light source 102 for producing extreme ultraviolet light 112, a set of reflective elements, and a target wafer 110. The reflective elements include a condenser 104, an EUV reflective mask 106, an optical reduction assembly 108, a mask blank, a mirror, or a combination thereof.

The extreme ultraviolet light source 102 generates the extreme ultraviolet light 112. The extreme ultraviolet light 112 is electromagnetic radiation having a wavelength in a range of 5 to 50 nanometers (nm). For example, the extreme ultraviolet light source 102 includes a laser, a laser produced plasma, a discharge produced plasma, a free-electron laser, synchrotron radiation, or a combination thereof.

The extreme ultraviolet light source 102 generates the extreme ultraviolet light 112 having a variety of characteristics. The extreme ultraviolet light source 102 produces broadband extreme ultraviolet radiation over a range of wavelengths. For example, the extreme ultraviolet light source 102 generates the extreme ultraviolet light 112 having wavelengths ranging from 5 to 50 nm.

In one or more embodiments, the extreme ultraviolet light source 102 produces the extreme ultraviolet light 112 having a narrow bandwidth. For example, the extreme ultraviolet light source 102 generates the extreme ultraviolet light 112 at 13.5 nm. The center of the wavelength peak is 13.5 nm.

The condenser 104 is an optical unit for reflecting and focusing the extreme ultraviolet light 112. The condenser 104 reflects and concentrates the extreme ultraviolet light 112 from the extreme ultraviolet light source 102 to illuminate the EUV reflective mask 106.

Although the condenser 104 is shown as a single element, it is understood that the condenser 104 can include one or more reflective elements such as concave mirrors, convex mirrors, flat mirrors, or a combination thereof, for reflecting and concentrating the extreme ultraviolet light 112. For example, the condenser 104 can be a single concave mirror or an optical assembly having convex, concave, and flat optical elements.

The EUV reflective mask 106 is an extreme ultraviolet reflective element having a mask pattern 114. The EUV reflective mask 106 creates a lithographic pattern to form a circuitry layout to be formed on the target wafer 110. The EUV reflective mask 106 reflects the extreme ultraviolet light 112. The mask pattern 114 defines a portion of a circuitry layout.

The optical reduction assembly 108 is an optical unit for reducing the image of the mask pattern 114. The reflection of the extreme ultraviolet light 112 from the EUV reflective mask 106 is reduced by the optical reduction assembly 108 and reflected on to the target wafer 110. The optical reduction assembly 108 can include mirrors and other optical elements to reduce the size of the image of the mask pattern 114. For example, the optical reduction assembly 108 can include concave mirrors for reflecting and focusing the extreme ultraviolet light 112.

The optical reduction assembly 108 reduces the size of the image of the mask pattern 114 on the target wafer 110. For example, the mask pattern 114 can be imaged at a 4:1 ratio by the optical reduction assembly 108 on the target wafer 110 to form the circuitry represented by the mask pattern 114 on the target wafer 110. The extreme ultraviolet light 112 can scan the EUV reflective mask 106 synchronously with the target wafer 110 to form the mask pattern 114 on the target wafer 110.

Figure 3:
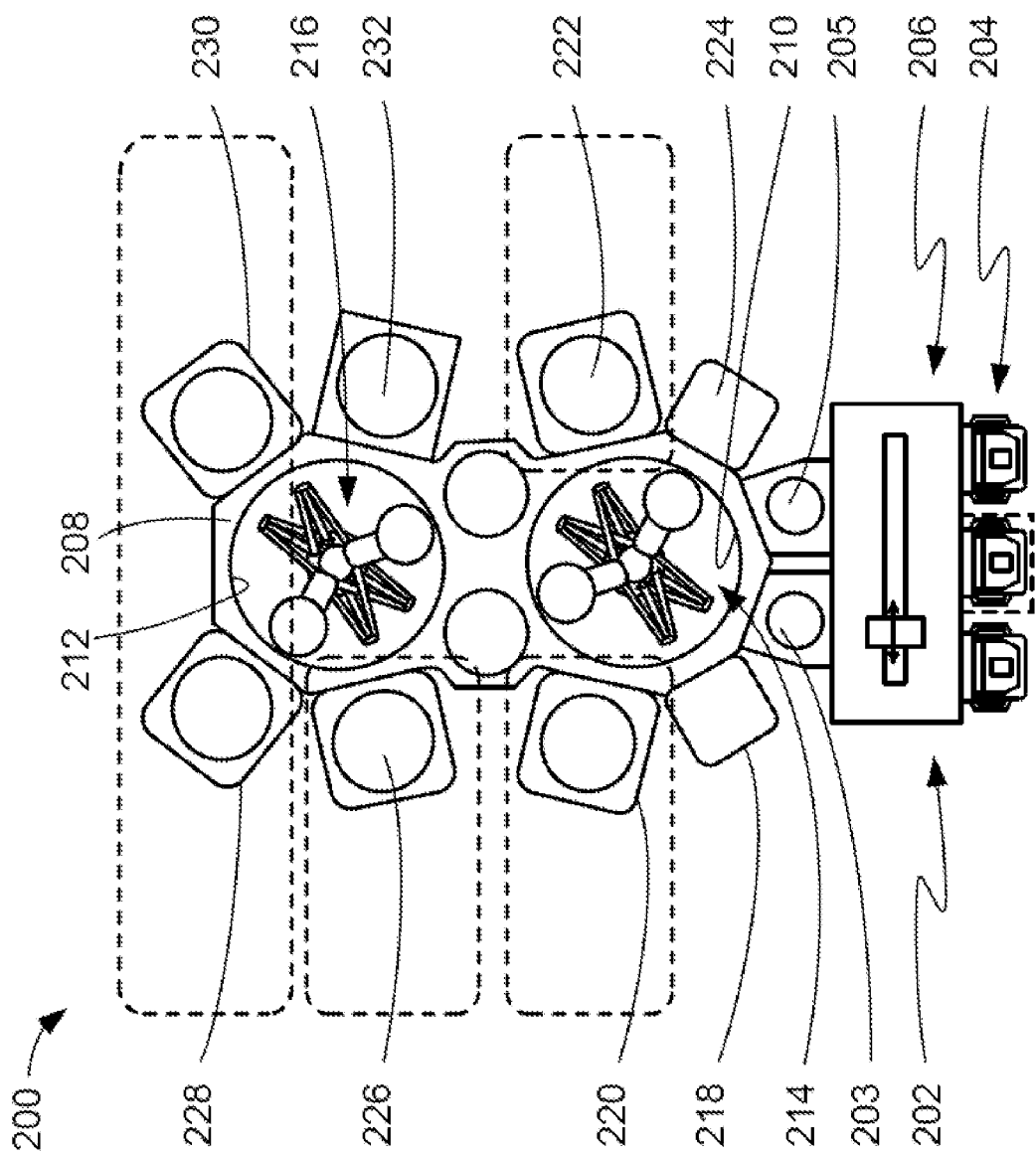
FIG. 3 illustrates an embodiment of an extreme ultraviolet reflective element production system.

Referring now to FIG. 3, an embodiment of of an extreme ultraviolet reflective element production system 200 is shown. The extreme ultraviolet reflective element includes a EUV mask blank 204, an extreme ultraviolet mirror 205, or other reflective element such as an EUV reflective mask 106.

The extreme ultraviolet reflective element production system 200 can produce mask blanks, mirrors, or other elements that reflect the extreme ultraviolet light 112 of FIG. 2. The extreme ultraviolet reflective element production system 200 fabricates the reflective elements by applying thin coatings to source substrates 203.

The EUV mask blank 204 is a multilayered structure for forming the EUV reflective mask 106 of FIG. 2. The EUV mask blank 204 can be formed using semiconductor fabrication techniques. The EUV reflective mask 106 can have the mask pattern 114 of FIG. 2 formed on the EUV mask blank 204 by etching and other processes.

The extreme ultraviolet mirror 205 is a multilayered structure reflective in a range of extreme ultraviolet light. The extreme ultraviolet mirror 205 can be formed using semiconductor fabrication techniques. The EUV mask blank 204 and the extreme ultraviolet mirror 205 can be similar structures with respect to the layers formed on each element, however, the extreme ultraviolet mirror 205 does not have the mask pattern 114.

The reflective elements are efficient reflectors of the extreme ultraviolet light 112. In an embodiment, the EUV mask blank 204 and the extreme ultraviolet mirror 205 has an extreme ultraviolet reflectivity of greater than 60%. The reflective elements are efficient if they reflect more than 60% of the extreme ultraviolet light 112.

The extreme ultraviolet reflective element production system 200 includes a wafer loading and carrier handling system 202 into which the source substrates 203 are loaded and from which the reflective elements are unloaded. An atmospheric handling system 206 provides access to a wafer handling vacuum chamber 208. The wafer loading and carrier handling system 202 can include substrate transport boxes, loadlocks, and other components to transfer a substrate from atmosphere to vacuum inside the system. Because the EUV mask blank 204 is used to form devices at a very small scale, the source substrates 203 and the EUV mask blank 204 are processed in a vacuum system to prevent contamination and other defects.

The wafer handling vacuum chamber 208 can contain two vacuum chambers, a first vacuum chamber 210 and a second vacuum chamber 212. The first vacuum chamber 210 includes a first wafer handling system 214 and the second vacuum chamber 212 includes a second wafer handling system 216. Although the wafer handling vacuum chamber 208 is described with two vacuum chambers, it is understood that the system can have any number of vacuum chambers.

The wafer handling vacuum chamber 208 can have a plurality of ports around its periphery for attachment of various other systems. The first vacuum chamber 210 has a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the wafers, mask blanks, mirrors, or other optical components.

The physical vapor deposition systems, such as the first physical vapor deposition system 220 and the second physical vapor deposition system 222, can be used to form thin films of conductive materials on the source substrates 203. For example, the physical vapor deposition systems can include vacuum deposition system such as magnetron sputtering systems, ion sputtering systems, pulsed laser deposition, cathode arc deposition, or a combination thereof. The physical vapor deposition systems, such as the magnetron sputtering system, form thin layers on the source substrates 203 including the layers of silicon, metals, alloys, compounds, or a combination thereof.

The physical vapor deposition system forms reflective layers, capping layers, and absorber layers. For example, the physical vapor deposition systems can form layers of silicon, molybdenum, titanium oxide, titanium dioxide, ruthenium oxide, niobium oxide, ruthenium tungsten, ruthenium molybdenum, ruthenium niobium, chromium, antimony, nitrides, compounds, or a combination thereof. Although some compounds are described as an oxide, it is understood that the compounds can include oxides, dioxides, atomic mixtures having oxygen atoms, or a combination thereof.

The second vacuum chamber 212 has a first multi-cathode source 226, a chemical vapor deposition system 228, a cure chamber 230, and an ultra-smooth deposition chamber 232 connected to it. For example, the chemical vapor deposition system 228 can include a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 can be in a separate system from the extreme ultraviolet reflective element production system 200.

The chemical vapor deposition system 228 can form thin films of material on the source substrates 203. For example, the chemical vapor deposition system 228 can be used to form layers of materials on the source substrates 203 including mono-crystalline layers, polycrystalline layers, amorphous layers, epitaxial layers, or a combination thereof. The chemical vapor deposition system 228 can form layers of silicon, silicon oxides, silicon oxycarbide, tantalum, tungsten, silicon carbide, silicon nitride, titanium nitride, metals, alloys, and other materials suitable for chemical vapor deposition. For example, the chemical vapor deposition system can form planarization layers.

The first wafer handling system 214 is capable of moving the source substrates 203 between the atmospheric handling system 206 and the various systems around the periphery of the first vacuum chamber 210 in a continuous vacuum. The second wafer handling system 216 is capable of moving the source substrates 203 around the second vacuum chamber 212 while maintaining the source substrates 203 in a continuous vacuum. The extreme ultraviolet reflective element production system 200 can transfer the source substrates 203 and the EUV mask blank 204 between the first wafer handling system 214 and the second wafer handling system 216 in a continuous vacuum.

Figure 4:
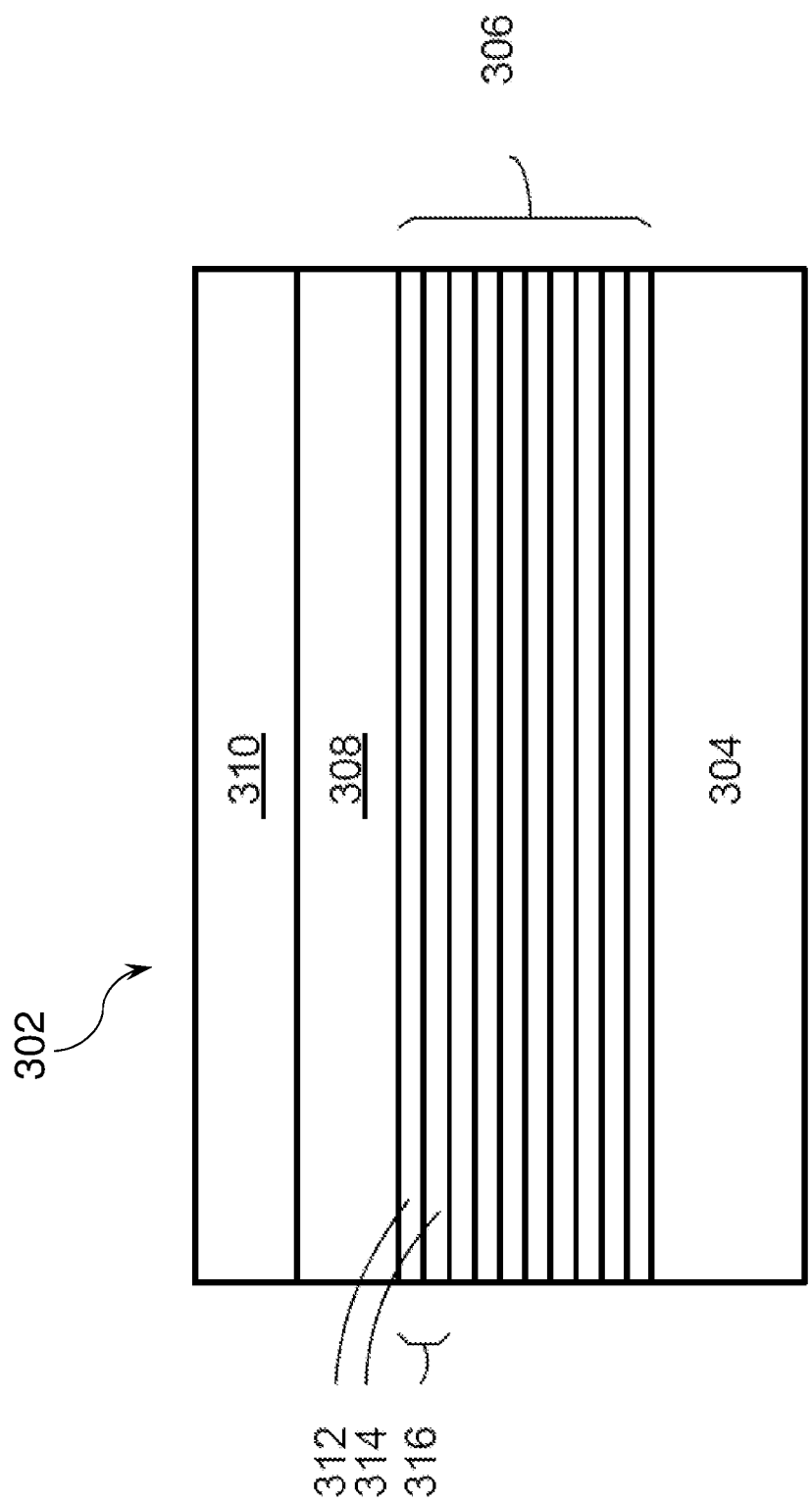
FIG. 4 illustrates an embodiment of an extreme ultraviolet reflective element such as an EUV mask blank.

Referring now to FIG. 4, an embodiment of an extreme ultraviolet reflective element 302 is shown. In one or more embodiments, the extreme ultraviolet reflective element 302 is the EUV mask blank 204 of FIG. 3 or the extreme ultraviolet mirror 205 of FIG. 3. The EUV mask blank 204 and the extreme ultraviolet mirror 205 are structures for reflecting the extreme ultraviolet light 112 of FIG. 2. The EUV mask blank 204 can be used to form the EUV reflective mask 106 shown in FIG. 2.

The extreme ultraviolet reflective element 302 includes a substrate 304, a multilayer stack 306 of reflective layers, and a capping layer 308. In one or more embodiments, the extreme ultraviolet mirror 205 is used to form reflecting structures for use in the condenser 104 of FIG. 2 or the optical reduction assembly 108 of FIG. 2.

The extreme ultraviolet reflective element 302, which can be a EUV mask blank 204, includes the substrate 304, the multilayer stack 306 of reflective layers, the capping layer 308, and an absorber layer 310. The extreme ultraviolet reflective element 302 can be a EUV mask blank 204, which is used to form the EUV reflective mask 106 of FIG. 2 by patterning the absorber layer 310 with the layout of the circuitry required.

In the following sections, the term for the EUV mask blank 204 is used interchangeably with the term of the extreme ultraviolet mirror 205 for simplicity. In one or more embodiments, the EUV mask blank 204 includes the components of the extreme ultraviolet mirror 205 with the absorber layer 310 added in addition to form the mask pattern 114 of FIG. 2.

The EUV mask blank 204 is an optically flat structure used for forming the EUV reflective mask 106 having the mask pattern 114. In one or more embodiments, the reflective surface of the EUV mask blank 204 forms a flat focal plane for reflecting the incident light, such as the extreme ultraviolet light 112 of FIG. 2.

The substrate 304 is an element for providing structural support to the extreme ultraviolet reflective element 302. In one or more embodiments, the substrate 304 is made from a material having a low coefficient of thermal expansion (CTE) to provide stability during temperature changes. In one or more embodiments, the substrate 304 has properties such as stability against mechanical cycling, thermal cycling, crystal formation, or a combination thereof. The substrate 304 according to one or more embodiments is formed from a material such as silicon, glass, oxides, ceramics, glass ceramics, or a combination thereof.

The multilayer stack 306 is a structure that is reflective to the extreme ultraviolet light 112. The multilayer stack 306 includes alternating reflective layers of a first reflective layer 312 and a second reflective layer 314.

The first reflective layer 312 and the second reflective layer 314 form a reflective pair 316 of FIG. 4. In a non-limiting embodiment, the multilayer stack 306 includes a range of 20-60 of the reflective pairs 316 for a total of up to 120 reflective layers.

The first reflective layer 312 and the second reflective layer 314 can be formed from a variety of materials. In an embodiment, the first reflective layer 312 and the second reflective layer 314 are formed from silicon and molybdenum, respectively. Although the layers are shown as silicon and molybdenum, it is understood that the alternating layers can be formed from other materials or have other internal structures.

The first reflective layer 312 and the second reflective layer 314 can have a variety of structures. In an embodiment, both the first reflective layer 312 and the second reflective layer 314 are formed with a single layer, multiple layers, a divided layer structure, non-uniform structures, or a combination thereof.

Because most materials absorb light at extreme ultraviolet wavelengths, the optical elements used are reflective instead of the transmissive as used in other lithography systems. The multilayer stack 306 forms a reflective structure by having alternating thin layers of materials with different optical properties to create a Bragg reflector or mirror.

In an embodiment, each of the alternating layers has dissimilar optical constants for the extreme ultraviolet light 112. The alternating layers provide a resonant reflectivity when the period of the thickness of the alternating layers is one half the wavelength of the extreme ultraviolet light 112. In an embodiment, for the extreme ultraviolet light 112 at a wavelength of 13 nm, the alternating layers are about 6.5 nm thick. It is understood that the sizes and dimensions provided are within normal engineering tolerances for typical elements.

The multilayer stack 306 can be formed in a variety of ways. In an embodiment, the first reflective layer 312 and the second reflective layer 314 are formed with magnetron sputtering, ion sputtering systems, pulsed laser deposition, cathode arc deposition, or a combination thereof.

In an illustrative embodiment, the multilayer stack 306 is formed using a physical vapor deposition technique, such as magnetron sputtering. In an embodiment, the first reflective layer 312 and the second reflective layer 314 of the multilayer stack 306 have the characteristics of being formed by the magnetron sputtering technique including precise thickness, low roughness, and clean interfaces between the layers. In an embodiment, the first reflective layer 312 and the second reflective layer 314 of the multilayer stack 306 have the characteristics of being formed by the physical vapor deposition including precise thickness, low roughness, and clean interfaces between the layers.

The physical dimensions of the layers of the multilayer stack 306 formed using the physical vapor deposition technique can be precisely controlled to increase reflectivity. In an embodiment, the first reflective layer 312, such as a layer of silicon, has a thickness of 4.1 nm. The second reflective layer 314, such as a layer of molybdenum, has a thickness of 2.8 nm. The thickness of the layers dictates the peak reflectivity wavelength of the extreme ultraviolet reflective element. If the thickness of the layers is incorrect, the reflectivity at the desired wavelength 13.5 nm can be reduced.

In an embodiment, the multilayer stack 306 has a reflectivity of greater than 60%. In an embodiment, the multilayer stack 306 formed using physical vapor deposition has a reflectivity in a range of 66%-67%. In one or more embodiments, forming the capping layer 308 over the multilayer stack 306 formed with harder materials improves reflectivity. In some embodiments, reflectivity greater than 70% is achieved using low roughness layers, clean interfaces between layers, improved layer materials, or a combination thereof.

In one or more embodiments, the capping layer 308 is a protective layer allowing the transmission of the extreme ultraviolet light 112. In an embodiment, the capping layer 308 is formed directly on the multilayer stack 306. In one or more embodiments, the capping layer 308 protects the multilayer stack 306 from contaminants and mechanical damage. In one embodiment, the multilayer stack 306 is sensitive to contamination by oxygen, tantalum, hydrotantalums, or a combination thereof. The capping layer 308 according to an embodiment interacts with the contaminants to neutralize them.

In one or more embodiments, the capping layer 308 is an optically uniform structure that is transparent to the extreme ultraviolet light 112. The extreme ultraviolet light 112 passes through the capping layer 308 to reflect off of the multilayer stack 306. In one or more embodiments, the capping layer 308 has a total reflectivity loss of 1% to 2%. In one or more embodiments, each of the different materials has a different reflectivity loss depending on thickness, but all of them will be in a range of 1% to 2%.

In one or more embodiments, the capping layer 308 has a smooth surface. For example, the surface of the capping layer 308 can have a roughness of less than 0.2 nm RMS (root mean square measure). In another example, the surface of the capping layer 308 has a roughness of 0.08 nm RMS for a length in a range of 1/100 nm and 1/1 μm. The RMS roughness will vary depending on the range it is measured over. For the specific range of 100 nm to 1 micron that roughness is 0.08 nm or less. Over a larger range the roughness will be higher.

The capping layer 308 can be formed in a variety of methods. In an embodiment, the capping layer 308 is formed on or directly on the multilayer stack 306 with magnetron sputtering, ion sputtering systems, ion beam deposition, electron beam evaporation, radio frequency (RF) sputtering, atomic layer deposition (ALD), pulsed laser deposition, cathode arc deposition, or a combination thereof. In one or more embodiments, the capping layer 308 has the physical characteristics of being formed by the magnetron sputtering technique including precise thickness, low roughness, and clean interfaces between the layers. In an embodiment, the capping layer 308 has the physical characteristics of being formed by the physical vapor deposition including precise thickness, low roughness, and clean interfaces between the layers.

In one or more embodiments, the capping layer 308 is formed from a variety of materials having a hardness sufficient to resist erosion during cleaning. In one embodiment, ruthenium is used as a capping layer material because it is a good etch stop and is relatively inert under the operating conditions. However, it is understood that other materials can be used to form the capping layer 308. In specific embodiments, the capping layer 308 has a thickness in a range of 2.5 and 5.0 nm.

In one or more embodiments, the absorber layer 310 is a layer that absorbs the extreme ultraviolet light 112. In an embodiment, the absorber layer 310 is used to form the pattern on the EUV reflective mask 106 by providing areas that do not reflect the extreme ultraviolet light 112. The absorber layer 310, according to one or more embodiments, comprises a material having a high absorption coefficient for a particular frequency of the extreme ultraviolet light 112, such as about 13.5 nm. In an embodiment, the absorber layer 310 is formed directly on the capping layer 308, and the absorber layer 310 is etched using a photolithography process to form the pattern of the EUV reflective mask 106.

According to one or more embodiments, the extreme ultraviolet reflective element 302, such as the extreme ultraviolet mirror 205, is formed with the substrate 304, the multilayer stack 306, and the capping layer 308. The extreme ultraviolet mirror 205 has an optically flat surface and can efficiently and uniformly reflect the extreme ultraviolet light 112.

According to one or more embodiments, the extreme ultraviolet reflective element 302, such as the EUV mask blank 204, is formed with the substrate 304, the multilayer stack 306, the capping layer 308, and the absorber layer 310. The mask blank 204 has an optically flat surface and can efficiently and uniformly reflect the extreme ultraviolet light 112. In an embodiment, the mask pattern 114 is formed with the absorber layer 310 of the EUV mask blank 204.

According to one or more embodiments, forming the absorber layer 310 over the capping layer 308 increases reliability of the EUV reflective mask 106. The capping layer 308 acts as an etch stop layer for the absorber layer 310. When the mask pattern 114 of FIG. 2 is etched into the absorber layer 310, the capping layer 308 beneath the absorber layer 310 stops the etching action to protect the multilayer stack 306. In one or more embodiments, the absorber layer 310 is etch selective to the capping layer 308. In some embodiments, the capping layer 308 comprises ruthenium, and the absorber layer 310 is etch selective to ruthenium.

In an embodiment, the absorber layer 310 comprises an alloy of tellurium, germanium and antimony. In some embodiments the absorber has a thickness of less than about 45 nm. In some embodiments, the absorber layer has a thickness of less than about 45 nm, including less than about 40 nm, less than about 35 nm, less than about 30 nm, less than about 25 nm, less than about 20 nm, less than about 15 nm, less than about 10 nm, less than about 5 nm, less than about 1 nm, or less than about 0.5 nm. In other embodiments, the absorber layer 310 has a thickness in a range of about 0.5 nm to about 45 nm, including a range of about 1 nm to about 44 nm, 1 nm to about 40 nm, and 15 nm to about 40 nm.

Without intending to be bound by theory, it is thought that an absorber layer 310 having a thickness of less than about 45 nm advantageously results in an absorber layer having a reflectively of less than about 2%, reducing and mitigating 3D mask effects in the extreme ultraviolet (EUV) mask blank.

In an embodiment, the absorber layer 310 is made from an alloy of tellurium, germanium and antimony. In one or more embodiments, the alloy of tellurium, germanium and antimony comprises about 33.9 wt. % to about 53.9 wt. % tellurium, about 6.8 wt. % to about 26.8 wt. % germanium, and about 21.3 wt. % to about 41.3 wt. % antimony based upon the total weight of the alloy. In one or more embodiments, the alloy of tellurium, germanium and antimony comprises about 38.9 wt. % to about 48.9 wt. % tellurium, about 11.8 wt. % to about 21.8 wt. % germanium, and about 26.3 wt. % to about 36.3 wt. % antimony based upon the total weight of the alloy. In one or more embodiments, the alloy of tellurium, germanium and antimony comprises about 43.9 wt. % tellurium, about 16.8 wt. % germanium, and about 31.3 wt. % antimony based upon the total weight of the alloy. In one or more embodiments, the alloy of tellurium, germanium and antimony is amorphous.

In some embodiments, the alloy of tellurium, germanium and antimony is doped with carbon in a range of 3 wt. % to 15 wt. % (e.g., 5 wt. % to 10 wt. %, such as about 8 wt. %). In other embodiments, the alloy of tellurium, germanium and antimony is doped with one of more of nitrogen or oxygen in a range of from 0.1 wt. % to 5 wt. %. In some embodiments, the alloy of tellurium, germanium and antimony is doped with carbon in a range of 3 wt. % to 15 wt. % (e.g., 5 wt. % to 10 wt. %, such as about 8 wt. %) and doped with one of more of nitrogen or oxygen in a range of from 0.1 wt. % to 5 wt. %.

In one or more embodiments, the alloy of tellurium, germanium and antimony comprises a dopant. The dopant may be selected from one or more of nitrogen or oxygen. In an embodiment, the dopant comprises oxygen. In an alternative embodiment, the dopant comprises nitrogen. In an embodiment, the dopant is present in the alloy in an amount in the range of about 0.1 wt. % to about 5 wt. %, based on the weight of the alloy. In other embodiments, the dopant is present in the alloy in an amount of about 0.1 wt. %, 0.2 wt. %, 0.3 wt. %, 0.4 wt. %, 0.5 wt. %, 0.6 wt. %, 0.7 wt. %. 0.8 wt. %, 0.9 wt. %, 1.0 wt. %, 1.1 wt. %, 1.2 wt. %, 1.3 wt. %, 1.4 wt. %, 1.5 wt. %, 1.6 wt. %, 1.7 wt. %. 1.8 wt. %, 1.9 wt. %, 2.0 wt. % 2.1 wt. %, 2.2 wt. %, 2.3 wt. %, 2.4 wt. %, 2.5 wt. %, 2.6 wt. %, 2.7 wt. %. 2.8 wt. %, 2.9 wt. %, 3.0 wt. %, 3.1 wt. %, 3.2 wt. %, 3.3 wt. %, 3.4 wt. %, 3.5 wt. %, 3.6 wt. %, 3.7 wt. %. 3.8 wt. %, 3.9 wt. %, 4.0 wt. %, 4.1 wt. %, 4.2 wt. %, 4.3 wt. %, 4.4 wt. %, 4.5 wt. %, 4.6 wt. %, 4.7 wt. %. 4.8 wt. %, 4.9 wt. %, or 5.0 wt. %.

In one or more embodiments, the alloy of the absorber layer is a co-sputtered alloy absorber material formed in a physical deposition chamber, which can provide much thinner absorber layer thickness (less than 30 nm) while achieving less than 2% reflectivity and suitable etch properties. In one or more embodiments, the alloy of the absorber layer can be co-sputtered by gases selected from one or more of argon (Ar), oxygen ($O_2$), or nitrogen ($N_2$). In an embodiment, the alloy of the absorber layer can be co-sputtered by a mixture of argon and oxygen gases (Ar+$O_2$). In some embodiments, co-sputtering by a mixture of argon and oxygen forms an oxide of tantalum and/or an oxide of antimony. In other embodiments, co-sputtering by a mixture of argon and oxygen does not form an oxide of tantalum or antimony. In an embodiment, the alloy of the absorber layer can be co-sputtered by a mixture of argon and nitrogen gases (Ar+$N_2$). In some embodiments, co-sputtering by a mixture of argon and nitrogen forms a nitride of tantalum and/or a nitride of antimony. In other embodiments, co-sputtering by a mixture of argon and nitrogen does not form a nitride of tantalum or antimony. In an embodiment, the alloy of the absorber layer can be co-sputtered by a mixture of argon and oxygen and nitrogen gases (Ar+$O_2$+$N_2$). In some embodiments, co-sputtering by a mixture of argon and oxygen and nitrogen forms an oxide and/or nitride of tantalum and/or an oxide and/or nitride of antimony. In other embodiments, co-sputtering by a mixture of argon and oxygen and nitrogen does not form an oxide or a nitride of tantalum or antimony. In an embodiment, the etch properties and/or other properties of the absorber layer can be tailored to specification by controlling the alloy percentage(s), as discussed above. In an embodiment, the alloy percentage(s) can be precisely controlled by operating parameters such voltage, pressure, flow, etc., of the physical vapor deposition chamber. In an embodiment, a process gas is used to further modify the material properties, for example, $N_2$ gas is used to form nitrides of tellurium, germanium and antimony.

In one or more embodiments, as used herein "co-sputtering" means that two targets, one target comprising tantalum and the second target comprising antimony are sputtered at the same time using one or more gas selected from argon (Ar), oxygen ($O_2$), or nitrogen ($N_2$) to deposit/form an absorber layer comprising an alloy of tellurium, germanium and antimony.

In other embodiments, the alloy of tellurium, germanium and antimony can be deposited layer by layer as a laminate of tellurium, germanium and antimony layers using gases selected from one or more of argon (Ar), oxygen ($O_2$), or nitrogen ($N_2$). In an embodiment, the alloy of the absorber layer can be deposited layer by layer as a laminate of tellurium and antimony layers using a mixture of argon and oxygen gases (Ar+$O_2$). In some embodiments, layer by layer deposition using a mixture of argon and oxygen forms an oxide of tantalum and/or an oxide of antimony. In other embodiments, layer by layer deposition using a mixture of argon and oxygen does not form an oxide of tantalum or antimony. In an embodiment, the alloy of the absorber layer can be deposited layer by layer as a laminate of tellurium, germanium and antimony layers using a mixture of argon and nitrogen gases (Ar+$N_2$). In some embodiments, layer by layer deposition using a mixture of argon and nitrogen forms a nitride of tantalum and/or a nitride of antimony. In other embodiments, layer by layer deposition using a mixture of argon and nitrogen does not form a nitride of tantalum or antimony. In an embodiment, the alloy of the absorber layer can be deposited layer by layer as a laminate of tellurium, germanium and antimony layers using a mixture of argon and oxygen and nitrogen gases (Ar+$O_2$+$N_2$). In some embodiments, layer by layer depositing using a mixture of argon and oxygen and nitrogen forms an oxide and/or nitride of tantalum and/or an oxide and/or nitride of antimony. In other embodiments, layer by layer deposition using a mixture of argon and oxygen and nitrogen does not form an oxide or a nitride of tantalum or antimony.

In one or more embodiments, bulk targets of the alloy compositions described herein may be made, which can be sputtered by normal sputtering using gases selected from one or more of argon (Ar), oxygen ($O_2$), or nitrogen ($N_2$). In one or more embodiments, the alloy is deposited using a bulk target having the same composition of the alloy and is sputtered using a gas selected from one or more of argon (Ar), oxygen ($O_2$), or nitrogen ($N_2$) to form the absorber layer. In an embodiment, the alloy of the absorber layer can be deposited using a bulk target having the same composition of the alloy and is sputtered using a mixture of argon and oxygen gases (Ar+$O_2$). In some embodiments, bulk target deposition using a mixture of argon and oxygen forms an oxide of tantalum and/or an oxide of antimony. In other embodiments, bulk target deposition using a mixture of argon and oxygen does not form an oxide of tantalum or antimony. In an embodiment, the alloy of the absorber layer can be deposited using a bulk target having the same composition of the alloy and is sputtered using a mixture of argon and nitrogen gases (Ar+$N_2$). In some embodiments, bulk target deposition using a mixture of argon and nitrogen forms a nitride of tantalum and/or a nitride of antimony. In other embodiments, bulk target deposition using a mixture of argon and nitrogen does not form a nitride of tantalum or antimony. In an embodiment, the alloy of the absorber layer can be deposited using a bulk target having the same composition of the alloy and is sputtered using a mixture of argon and oxygen and nitrogen gases (Ar+$O_2$+$N_2$). In some embodiments, bulk target depositing using a mixture of argon and oxygen and nitrogen forms an oxide and/or nitride of tantalum and/or an oxide and/or nitride of antimony. In other embodiments, bulk target deposition using a mixture of argon and oxygen and nitrogen does not form an oxide or a nitride of tantalum or antimony. In some embodiments, the alloy of tellurium, germanium and antimony is doped with carbon in a range of 3 wt. % to 15 wt. % (e.g., 5 wt. % to 10 wt. %, such as about 8 wt. %). In other embodiments, the alloy of tellurium, germanium and antimony is doped with one or more of nitrogen or oxygen in a range of from 0.1 wt. % to 5 wt. %. In some embodiments, the alloy of tellurium, germanium and antimony is doped with carbon in a range of 3 wt. % to 15 wt. % (e.g., 5 wt. % to 10 wt. %, such as about 8 wt. %) and doped with one of more of nitrogen or oxygen in a range of from 0.1 wt. % to 5 wt. %. In embodiments in which the alloy of tellurium, germanium and antimony is doped with carbon, the carbon doping can be achieved by co-sputtering with a carbon target, or by sputtering with a target comprising carbon, tellurium, germanium and antimony.

The EUV mask blank can be made in a physical deposition chamber having a first cathode comprising a first absorber material, a second cathode comprising a second absorber material, a third cathode comprising a third absorber material, a fourth cathode comprising a fourth absorber material, and a fifth cathode comprising a fifth absorber material, wherein the first absorber material, second absorber material, third absorber material, fourth absorber material and fifth absorber materials are different from each other, and each of the absorber materials have an extinction coefficient that is different from the other materials, and each of the absorber materials have an index of refraction that is different from the other absorber materials.

Figure 5:
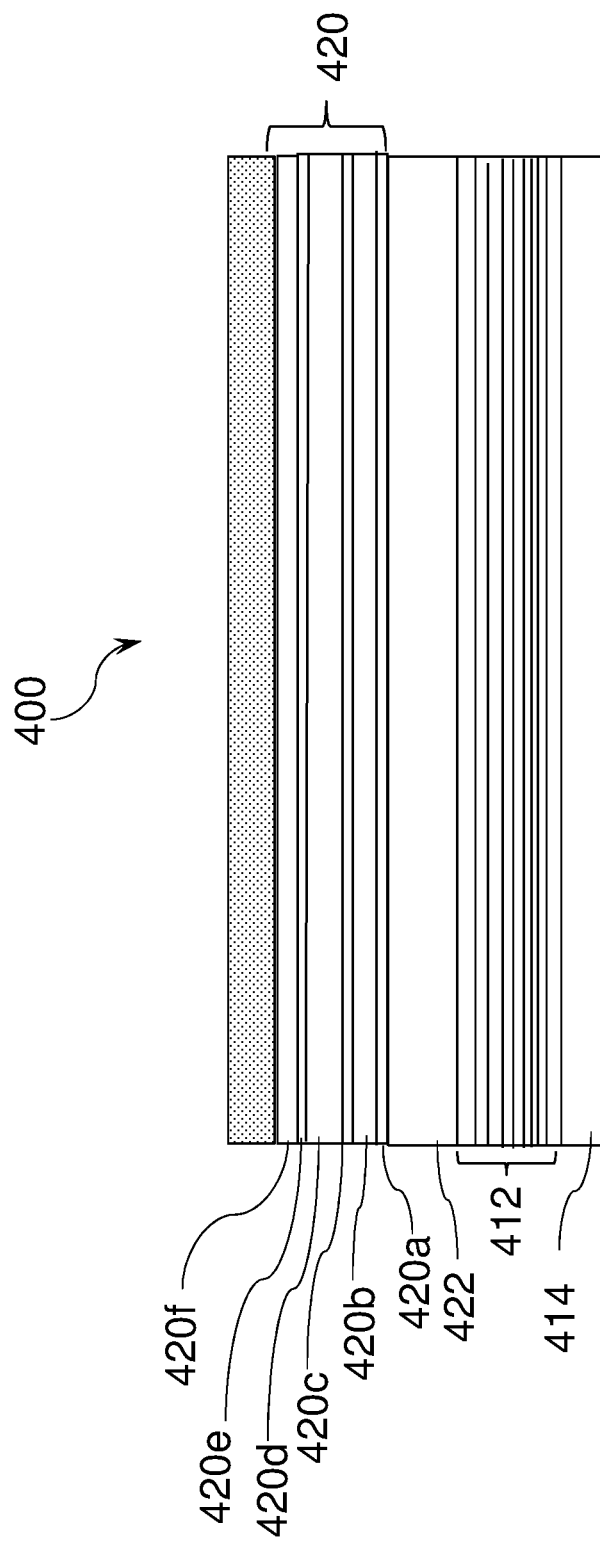
FIG. 5 illustrates an embodiment of an extreme ultraviolet reflective element such as an EUV mask blank.

Referring now to FIG. 5, an extreme ultraviolet mask blank 400 is shown as comprising a substrate 414, a multilayer stack of reflective layers 412 on the substrate 414, the multilayer stack of reflective layers 412 including a plurality of reflective layer pairs. In one or more embodiments, the plurality of reflective layer pairs are made from a material selected from a molybdenum (Mo) containing material and silicon (Si) containing material. In some embodiments, the plurality of reflective layer pairs comprise alternating layers of molybdenum and silicon. The extreme ultraviolet mask blank 400 further includes a capping layer 422 on the multilayer stack of reflective layers 412, and there is a multilayer stack 420 of absorber layers on the capping layer 422. In one or more embodiment, the plurality of reflective layers 412 is selected from a molybdenum (Mo) containing material and a silicon (Si) containing material and the capping layer 422 comprises ruthenium.

The multilayer stack 420 of absorber layers includes a plurality of absorber layer pairs 420a, 420b, 420c, 420d, 420e, 420f, each pair (420a/420b, 420c/420d, 420e/420f) comprising an alloy of tellurium, germanium and antimony. In some embodiments, the alloy of tellurium, germanium and antimony comprises about 33.9 wt. % to about 53.9 wt. % tellurium, about 6.8 wt. % to about 26.8 wt. % germanium, and about 21.3 wt. % to about 41.3 wt. % antimony based upon the total weight of the alloy. In one or more embodiments, the alloy of tellurium, germanium and antimony comprises about 38.9 wt. % to about 48.9 wt. % tellurium, about 11.8 wt. % to about 21.8 wt. % germanium, and about 26.3 wt. % to about 36.3 wt. % antimony based upon the total weight of the alloy. In one or more embodiments, the alloy of tellurium, germanium and antimony comprises about 43.9 wt. % tellurium, about 16.8 wt. % germanium, and about 31.3 wt. % antimony based upon the total weight of the alloy. In one or more embodiments, the alloy of tellurium, germanium and antimony is amorphous.

In one example, absorber layer 420a is made from antimony and the material that forms absorber layer 420b is tantalum. Likewise, absorber layer 420c is made from antimony and the material that forms absorber layer 420d is tantalum, and absorber layer 420e is made from antimony material and the material that forms absorber layer 420f is tantalum.

In one embodiment, the extreme ultraviolet mask blank 400 includes the plurality of reflective layers 412 selected from molybdenum (Mo) containing material and silicon (Si) containing material, for example, molybdenum (Mo) and silicon (Si). The absorber materials that are used to form the absorber layers 420a, 420b, 420c, 420d, 420e and 420f are an alloy of tellurium, germanium and antimony. In some embodiments, the alloy of tellurium, germanium and antimony comprises about 33.9 wt. % to about 53.9 wt. % tellurium, about 6.8 wt. % to about 26.8 wt. % germanium, and about 21.3 wt. % to about 41.3 wt. % antimony based upon the total weight of the alloy. In one or more embodiments, the alloy of tellurium, germanium and antimony comprises about 38.9 wt. % to about 48.9 wt. % tellurium, about 11.8 wt. % to about 21.8 wt. % germanium, and about 26.3 wt. % to about 36.3 wt. % antimony based upon the total weight of the alloy. In one or more embodiments, the alloy of tellurium, germanium and antimony comprises about 43.9 wt. % tellurium, about 16.8 wt. % germanium, and about 31.3 wt. % antimony based upon the total weight of the alloy. In one or more embodiments, the alloy of tellurium, germanium and antimony is amorphous.

In one or more embodiments, the absorber layer pairs 420a/420b, 420c/420d, 420e/420f comprise a first layer (420a, 420c, 420e) including an absorber material comprising an alloy of tellurium, germanium and antimony and a second absorber layer (420b, 420d, 420f) including an absorber material including an alloy of tellurium, germanium and antimony. In specific embodiments, the absorber layer pairs comprise a first layer (420a, 420c, 420e) including an alloy of tellurium, germanium and antimony, the alloy of tellurium, germanium and antimony selected from an alloy having about the alloy of tellurium, germanium and antimony, and a second absorber layer (420b, 420d, 420f) including an absorber material including an alloy of tellurium, germanium and antimony.

According to one or more embodiments, the absorber layer pairs comprise a first layer (420a, 420c, 420e) and a second absorber layer (420b, 420d, 420f) each of the first absorber layers (420a, 420c, 420e) and second absorber layer (420b, 420d, 420f) have a thickness in a range of 0.1 nm and 10 nm, for example in a range of 1 nm and 5 nm, or in a range of 1 nm and 3 nm. In one or more specific embodiments, the thickness of the first layer 420a is 0.5 nm, 0.6 nm, 0.7 nm, 0.8 nm, 0.9 nm, 1 nm, 1.1 nm, 1.2 nm, 1.3 nm, 1.4 nm, 1.5 nm, 1.6 nm, 1.7 nm, 1.8 nm, 1.9 nm, 2 nm, 2.1 nm, 2.2 nm, 2.3 nm, 2.4 nm, 2.5 nm, 2.6 nm, 2.7 nm, 2.8 nm, 2.9 nm, 3 nm, 3.1 nm, 3.2 nm, 3.3 nm, 3.4 nm, 3.5 nm, 3.6 nm, 3.7 nm, 3.8 nm, 3.9 nm, 4 nm, 4.1 nm, 4.2 nm, 4.3 nm, 4.4 nm, 4.5 nm, 4.6 nm, 4.7 nm, 4.8 nm, 4.9 nm, and 5 nm. In one or more embodiments, the thickness of the first absorber layer and second absorber layer of each pair is the same or different. For example, the first absorber layer and second absorber layer have a thickness such that there is a ratio of the first absorber layer thickness to second absorber layer thickness of 1:1, 1.5:1, 2:1, 2.5:1, 3:1, 3.5:1, 4:1, 4.5:1, 5:1, 6:1, 7:1, 8:1, 9:1, 10:1, 11:1, 12:1, 13:1, 14:1, 15:1, 16:1, 17:1, 18:1, 19:1, or 20:1, which results in the first absorber layer having a thickness that is equal to or greater than the second absorber layer thickness in each pair. Alternatively, the first absorber layer and second absorber layer have a thickness such that there is a ratio of the second absorber layer thickness to first absorber layer thickness of 1.5:1, 2:1, 2.5:1, 3:1, 3.5:1, 4:1, 4.5:1, 5:1, 6:1, 7:1, 8:1, 9:1, 10:1, 11:1, 12:1, 13:1, 14:1, 15:1, 16:1, 17:1, 18:1, 19:1, or 20:1 which results in the second absorber layer having a thickness that is equal to or greater than the first absorber layer thickness in each pair.

According to one or more embodiments, the different absorber materials and thickness of the absorber layers are selected so that extreme ultraviolet light is absorbed due to absorbance and due to a phase change caused by destructive interfere with light from the multilayer stack of reflective layers. While the embodiment shown in FIG. 5 shows three absorber layer pairs, 420a/420b, 420c/420d and 420e/420f, the claims should not be limited to a particular number of absorber layer pairs. According to one or more embodiments, the EUV mask blank 400 can include in a range of 5 and 60 absorber layer pairs or in a range of 10 and 40 absorber layer pairs.

According to one or more embodiments, the absorber layers have a thickness which provides less than 2% reflectivity and other etch properties. A supply gas can be used to further modify the material properties of the absorber layers, for example, nitrogen ($N_2$) gas can be used to form nitrides of the materials provided above. The multilayer stack of absorber layers according to one or more embodiments is a repetitive pattern of individual thickness of different materials so that the EUV light not only gets absorbed due to absorbance but by the phase change caused by multilayer absorber stack, which will destructively interfere with light from multilayer stack of reflective materials beneath to provide better contrast.

Another aspect of the disclosure pertains to a method of manufacturing an extreme ultraviolet (EUV) mask blank comprising forming on a substrate a multilayer stack of reflective layers on the substrate, the multilayer stack including a plurality of reflective layer pairs, forming a capping layer on the multilayer stack of reflective layers, and forming absorber layer on the capping layer, the absorber layer comprising an alloy of tellurium, germanium and antimony, wherein the alloy of tellurium, germanium and antimony comprises about 33.9 wt. % to about 53.9 wt. % tellurium, about 6.8 wt. % to about 26.8 wt. % germanium, and about 21.3 wt. % to about 41.3 wt. % antimony based upon the total weight of the alloy. In one or more embodiments, the alloy of tellurium, germanium and antimony comprises about 38.9 wt. % to about 48.9 wt. % tellurium, about 11.8 wt. % to about 21.8 wt. % germanium, and about 26.3 wt. % to about 36.3 wt. % antimony based upon the total weight of the alloy. In one or more embodiments, the alloy of tellurium, germanium and antimony comprises about 43.9 wt. % tellurium, about 16.8 wt. % germanium, and about 31.3 wt. % antimony based upon the total weight of the alloy. In one or more embodiments, the alloy of tellurium, germanium and antimony is amorphous.

The EUV mask blank can have any of the characteristics of the embodiments described above with respect to FIG. 4 and FIG. 5, and the method can be performed in the system described with respect to FIG. 3.

Thus, in an embodiment, the plurality of reflective layers are selected from molybdenum (Mo) containing material and silicon (Si) containing material and the absorber layer is an alloy of tellurium, germanium and antimony, wherein the alloy of tellurium, germanium and antimony comprises about the alloy of tellurium, germanium and antimony comprises about 33.9 wt. % to about 53.9 wt. % tellurium, about 6.8 wt. % to about 26.8 wt. % germanium, and about 21.3 wt. % to about 41.3 wt. % antimony based upon the total weight of the alloy. In one or more embodiments, the alloy of tellurium, germanium and antimony comprises about 38.9 wt. % to about 48.9 wt. % tellurium, about 11.8 wt. % to about 21.8 wt. % germanium, and about 26.3 wt. % to about 36.3 wt. % antimony based upon the total weight of the alloy. In one or more embodiments, the alloy of tellurium, germanium and antimony comprises about 43.9 wt. % tellurium, about 16.8 wt. % germanium, and about 31.3 wt. % antimony based upon the total weight of the alloy. In one or more embodiments, the alloy of tellurium, germanium and antimony is amorphous.

Figure 6:
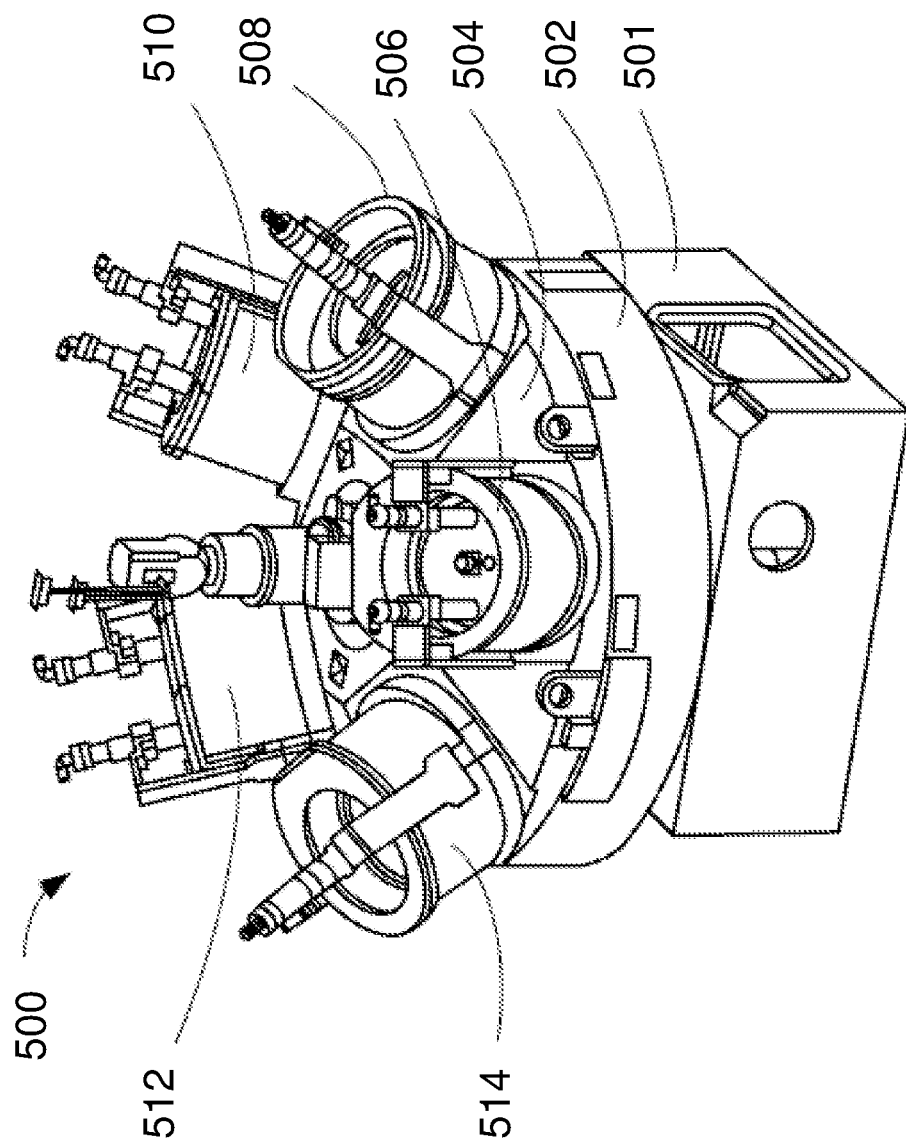
FIG. 6 illustrates an embodiment of a multi-cathode physical deposition chamber.

In another specific method embodiment, the different absorber layers are formed in a physical deposition chamber having a first cathode comprising a first absorber material and a second cathode comprising a second absorber material. Referring now to FIG. 6 an upper portion of a multi-cathode source chamber 500 is shown in accordance with an embodiment. The multi-cathode chamber 500 includes a base structure 501 with a cylindrical body portion 502 capped by a top adapter 504. The top adapter 504 has provisions for a number of cathode sources, such as cathode sources 506, 508, 510, 512, and 514, positioned around the top adapter 504.

In one or more embodiments, the method forms an absorber layer that has a thickness in a range of 5 nm and 60 nm. In one or more embodiments, the absorber layer has a thickness in a range of 51 nm and 57 nm. In one or more embodiments, the materials used to form the absorber layer are selected to effect etch properties of the absorber layer. In one or more embodiments, The alloy of the absorber layer is formed by co-sputtering an alloy absorber material formed in a physical deposition chamber, which can provide much thinner absorber layer thickness (less than 30 nm) and achieving less than 2% reflectivity and desired etch properties. In an embodiment, the etch properties and other desired properties of the absorber layer can be tailored to specification by controlling the alloy percentage of each absorber material. In an embodiment, the alloy percentage can be precisely controlled by operating parameters such voltage, pressure, flow etc., of the physical vapor deposition chamber. In an embodiment, a process gas is used to further modify the material properties, for example, $N_2$ gas is used to form nitrides of tellurium, germanium and antimony. The alloy absorber material can comprise an alloy of tellurium, germanium and antimony selected from an alloy comprising about the alloy of tellurium, germanium and antimony comprises about 33.9 wt. % to about 53.9 wt. % tellurium, about 6.8 wt. % to about 26.8 wt. % germanium, and about 21.3 wt. % to about 41.3 wt. % antimony based upon the total weight of the alloy. In one or more embodiments, the alloy of tellurium, germanium and antimony comprises about 38.9 wt. % to about 48.9 wt. % tellurium, about 11.8 wt. % to about 21.8 wt. % germanium, and about 26.3 wt. % to about 36.3 wt. % antimony based upon the total weight of the alloy. In one or more embodiments, the alloy of tellurium, germanium and antimony comprises about 43.9 wt. % tellurium, about 16.8 wt. % germanium, and about 31.3 wt. % antimony based upon the total weight of the alloy. In one or more embodiments, the alloy of tellurium, germanium and antimony is amorphous.

The multi-cathode source chamber 500 can be part of the system shown in FIG. 3. In an embodiment, an extreme ultraviolet (EUV) mask blank production system comprises a substrate handling vacuum chamber for creating a vacuum, a substrate handling platform, in the vacuum, for transporting a substrate loaded in the substrate handling vacuum chamber, and multiple sub-chambers, accessed by the substrate handling platform, for forming an EUV mask blank, including a multilayer stack of reflective layers on the substrate, the multilayer stack including a plurality of reflective layer pairs, a capping layer on the multilayer stack of reflective layers, and an absorber layer on the capping layer, the absorber layer made from an alloy of tellurium, germanium and antimony. The system can be used to make the EUV mask blanks shown with respect to FIG. 4 or FIG. 5 and have any of the properties described with respect to the EUV mask blanks described with respect to FIG. 4 or FIG. 5 above.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an extreme ultraviolet (EUV) mask blank comprising:
   forming on a substrate a multilayer stack which reflects EUV radiation, the multilayer stack comprising a plurality of reflective layer pairs;
   forming a capping layer on the multilayer stack; and
   forming an absorber layer on the capping layer, the absorber layer comprising an alloy of tellurium, germanium and antimony.

2. The method of claim 1, wherein the alloy of tellurium, germanium and antimony comprises about 33.9 wt. % to about 53.9 wt. % tellurium, about 6.8 wt. % to about 26.8 wt. % germanium, and about 21.3 wt. % to about 41.3 wt. % antimony.

3. The method of claim 1, wherein the alloy of tellurium, germanium and antimony comprises about 38.9 wt. % to about 48.9 wt. % tellurium, about 11.8 wt. % to about 21.8 wt. % germanium, and about 26.3 wt. % to about 36.3 wt. % antimony.

4. The method of claim 2, wherein the alloy of tellurium, germanium and antimony comprises about 43.9 wt. % tellurium, about 16.8 wt. % germanium, and about 31.3 wt. % antimony.

5. The method of claim 3, wherein the alloy of tellurium, germanium and antimony is amorphous.

6. The method of claim 1, wherein the alloy is formed by co-sputtering the tellurium, germanium and antimony with a gas selected from one or more of argon (Ar), oxygen ($O_2$), or nitrogen ($N_2$) to form the absorber layer.

7. The method of claim 1, wherein the alloy is deposited layer by layer as a laminate of tellurium, germanium and antimony layers using a gas selected from one or more of argon (Ar), oxygen ($O_2$), or nitrogen ($N_2$) to form the absorber layer.

8. The method of claim 1, wherein the alloy is deposited using a bulk target having the same composition as the alloy and is sputtered using a gas selected from one or more of argon (Ar), oxygen ($O_2$), or nitrogen ($N_2$) to form the absorber layer.

9. The method of claim 2, wherein the alloy of tellurium, germanium and antimony is doped with carbon in a range of 3 wt. % to 15 wt. % and doped with one of more of nitrogen or oxygen in a range of from 0.1 wt. % to 5 wt. %.

10. The method of claim 3, wherein the alloy of tellurium, germanium and antimony is doped with carbon in a range of 5 wt. % to 10 wt. % and doped with one of more of nitrogen or oxygen in a range of from about 0.1 wt. % to about 5 wt. %.

11. An extreme ultraviolet (EUV) mask blank comprising:
a substrate;
a multilayer stack which reflects EUV radiation, the multilayer stack comprising a plurality of reflective layer pairs;
a capping layer on the multilayer stack of reflecting layers; and
an absorber layer comprising an alloy of tellurium, germanium and antimony.

12. The extreme ultraviolet (EUV) mask blank of claim 11, wherein the alloy of tellurium, germanium and antimony comprises about 33.9 wt. % to about 53.9 wt. % tellurium, about 6.8 wt. % to about 26.8 wt. % germanium, and about 21.3 wt. % to about 41.3 wt. % antimony.

13. The extreme ultraviolet (EUV) mask blank of claim 11, the alloy of tellurium, germanium and antimony comprises about 38.9 wt. % to about 48.9 wt. % tellurium, about 11.8 wt. % to about 21.8 wt. % germanium, and about 26.3 wt. % to about 36.3 wt. % antimony.

14. The extreme ultraviolet (EUV) mask blank of claim 12, wherein the alloy of tellurium, germanium and antimony comprises about 43.9 wt. % tellurium, about 16.8 wt. % germanium, and about 31.3 wt. % antimony.

15. The extreme ultraviolet (EUV) mask blank of claim 13, wherein the alloy of tellurium, germanium and antimony is amorphous.

16. The extreme ultraviolet (EUV) mask blank of claim 11, wherein the absorber layer has a thickness of less than 45 nm.

17. The extreme ultraviolet (EUV) mask blank of claim 11, wherein the absorber layer further comprises a range of rom about 0.1 wt. % to about 5 wt. % of a dopant selected from one or more of nitrogen or oxygen.

18. The extreme ultraviolet (EUV) mask blank of claim 11, wherein the absorber layer has a thickness of less than 45 nm.

19. The extreme ultraviolet (EUV) mask blank of claim 11, wherein the absorber layer is etch selective relative to the capping layer.

20. An extreme ultraviolet (EUV) mask blank comprising:
a substrate;
a multilayer stack which reflects EUV radiation, the multilayer stack comprising a plurality of reflective layer pairs including molybdenum (Mo) and silicon (Si);
a capping layer on the multilayer stack of reflecting layers; and
an absorber layer comprising an alloy of tellurium, germanium and antimony.

* * * * *